United States Patent
Grenouillet et al.

(10) Patent No.: US 9,123,814 B2
(45) Date of Patent: Sep. 1, 2015

(54) FIELD EFFECT DEVICE PROVIDED WITH A THINNED COUNTER-ELECTRODE AND METHOD FOR FABRICATING

(75) Inventors: Laurent Grenouillet, Rives (FR); Maud Vinet, Rives (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 640 days.

(21) Appl. No.: 13/352,784

(22) Filed: Jan. 18, 2012

(65) Prior Publication Data

US 2012/0187488 A1 Jul. 26, 2012

(30) Foreign Application Priority Data

Jan. 24, 2011 (FR) ..................... 11 00200

(51) Int. Cl.
 - *H01L 27/12* (2006.01)
 - *H01L 29/786* (2006.01)
 - *H01L 21/265* (2006.01)
 - *H01L 29/66* (2006.01)

(52) U.S. Cl.
 CPC .... *H01L 29/78603* (2013.01); *H01L 21/26586* (2013.01); *H01L 29/66772* (2013.01); *H01L 29/78648* (2013.01)

(58) Field of Classification Search
 CPC ............... H01L 29/78603; H01L 29/78648
 USPC ............ 257/328, 351, 369, 347, 338, 57, 59
 See application file for complete search history.

(56) References Cited

U.S. PATENT DOCUMENTS

| | | | |
|---|---|---|---|
| 5,359,219 A * | 10/1994 | Hwang | 257/351 |
| 5,633,182 A * | 5/1997 | Miyawaki et al. | 438/30 |
| 5,889,306 A | 3/1999 | Christensen et al. | |
| 7,023,054 B2 * | 4/2006 | Ohsawa | 257/369 |
| 7,259,428 B2 * | 8/2007 | Inaba | 257/347 |
| 7,626,200 B2 * | 12/2009 | Tayanaka | 257/59 |
| 7,638,840 B2 * | 12/2009 | Ohsawa | 257/338 |
| 8,674,360 B2 * | 3/2014 | Okazaki | 257/57 |
| 2002/0066924 A1 * | 6/2002 | Blanchard | 257/328 |
| 2003/0203546 A1 * | 10/2003 | Burbach et al. | 438/151 |
| 2004/0164305 A1 | 8/2004 | Keshavarzi et al. | |
| 2005/0045947 A1 | 3/2005 | Chen et al. | |
| 2006/0110863 A1 * | 5/2006 | Yamamoto et al. | 438/149 |

* cited by examiner

*Primary Examiner* — Zandra Smith
*Assistant Examiner* — John M Parker
(74) *Attorney, Agent, or Firm* — Oliff PLC (57) ABSTRACT

A field effect device comprises a substrate of semiconductor on insulator type successively provided with a support substrate, an electrically insulating layer and a semiconductor material film. First and second source/drain electrodes are formed in the semiconductor material layer. A conduction channel is formed in the semiconductor material layer and separates the first and second source/drain electrodes. A counter-electrode is formed in the support substrate and faces the first and second source/drain electrodes and the conduction channel. The counter-electrode is formed by a doped area of the support substrate having a first doping impurity concentration which decreases from an interface between the electrically insulating layer and the support substrate.

7 Claims, 5 Drawing Sheets

FIELD EFFECT DEVICE PROVIDED WITH A THINNED COUNTER-ELECTRODE AND METHOD FOR FABRICATING

BACKGROUND OF THE INVENTION

The invention relates to a field effect device formed on a substrate of semi-conductor on insulator type with a counter-electrode.

The invention also relates to a method for fabricating one such field effect device.

STATE OF THE ART

With the continuous reduction of their dimensions, active devices of integrated circuit, such as transistors, are confronted with physical phenomena which manifest themselves by parasitic effects on the main electric characteristics of the devices, for example short channel effect. In order to remedy a certain number of these drawbacks, different solutions are envisaged.

The substrates on which the transistors are integrated have been modified in order to reduce certain of the parasitic phenomena of the transistors. These improved substrates are of semiconductor on insulator type. They are formed by a layer of semiconductor material separated from the support substrate by a dielectric material. Depending on the thickness of the layer of semi-conductor material on which the field effect transistor is integrated, the substrate is said to be partially or fully depleted.

By successively using substrates of partially depleted and then fully depleted semiconductor on insulator type, the race towards miniaturization and on-going improvement of transistors has been able to be pursued.

Substrates of fully depleted semiconductor on insulator type were then modified by reducing the thickness of the dielectric material layer and integrating a doped layer in the support substrate. This doped layer is made in proximity to the dielectric layer in order to form a ground plane. This ground plane enables better control of the parasitic effects of the transistor integrated on the semiconductor material layer, in particular short channel effect, by means of improved control of drain induced barrier lowering (DIBL). The use of a ground plane also enables the electric characteristics of the transistor to be easily modified, typically by making its threshold voltage vary.

However the use of a ground plane requires additional technological steps to be integrated, which inevitably leads to new constraints on fabrication.

As illustrated in the document U.S. Pat. No. 5,889,306, the ground plane is formed in the support substrate by ion implantation through the semiconductor on insulator film and the electrically insulating layer. The ground plane is formed at the beginning of the method in order to facilitate implementation.

However, with this type of integration layout associated with the continuous reduction of the dimensions of the transistor, a degradation of the transistor performances is observed in comparison with the expected theoretical results. Likewise, this type of implementation method becomes difficult to set up as the depthwise penetration of the counter-electrodes is large which requires the use of numerous specific insulating means.

OBJECT OF THE INVENTION

It is observed that a requirement exists to provide a field effect transistor provided with a counter-electrode which presents reduced dimensions.

This requirement tends to be satisfied by means of a device which comprises:
a substrate of semiconductor on insulator type successively provided with a support substrate, an electrically insulating layer and a film made from semiconductor material,
first and second source/drain electrodes formed in the semiconductor material layer,
a conduction channel formed in the semiconductor material layer and separating the first and second source/drain electrodes,
a counter-electrode formed in the support substrate and facing the first and second source/drain electrodes and the conduction channel, the counter-electrode being formed in a doped area of the support substrate having a decreasing first doping impurity concentration when moving away from an interface between the electrically insulating layer and the support substrate.

It is also observed that a requirement exists to provide a method for fabricating such a transistor that is easy to implement and can easily be co-integrated with electronic circuit fabrication methods.

The device is produced according to a method comprising the following steps:
providing a substrate successively provided with a support substrate with a first semiconductor material film, an electrically insulating layer, a second semiconductor material film, and a gate electrode separated from the second semiconductor material film by a gate dielectric,
performing ion implantation of a first doping impurity with a non-zero angle with respect to the surface of the second semiconductor material film so as to form a doped area with a first type of conductivity in the first semiconductor material film opposite the gate electrode, the first doping impurity concentration decreasing from the interface between the first semiconductor material film and the electrically insulating layer when moving away from the electrically insulating layer.

BRIEF DESCRIPTION OF THE DRAWINGS

Other advantages and features will become more clearly apparent from the following description of particular embodiments of the invention given for non-restrictive example purposes only and illustrated by means of the appended drawings, in which.

DESCRIPTION OF PREFERRED EMBODIMENTS OF THE INVENTION

Figure 1:
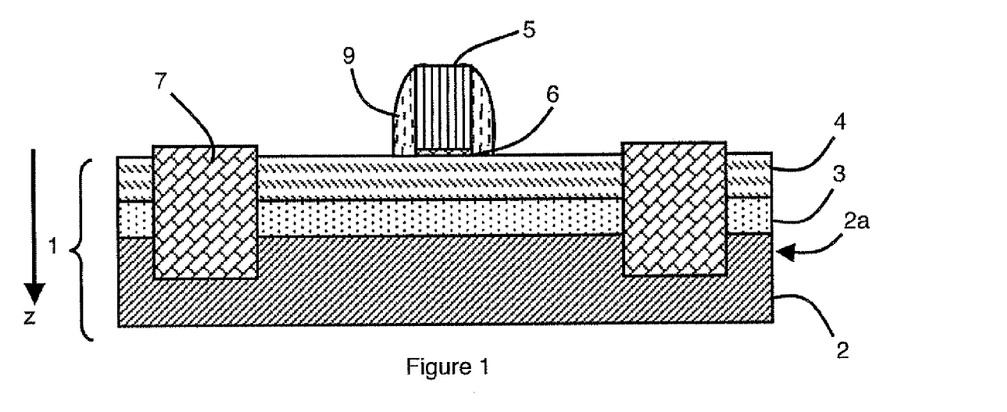
FIGS. 1 to 3 schematically represent different steps of production of a device, in cross-section.

As illustrated in FIG. 1, a substrate 1 of semiconductor on insulator type successively comprises a support substrate 2, an electrically insulating layer 3 and a semiconductor material film 4. Semiconductor material film 4 is a layer that is said to be active as it is designed to integrate one or more field effect transistors or other devices.

Support substrate 2 comprises a semiconductor material film 2a which is in contact with electrically insulating layer 3. Depending on the embodiments, substrate 2 can be formed by one and the same semiconductor material or by a plurality of different films that can be electrically conductive or not. In preferential manner, support substrate 2 is formed by a semiconductor material, for example silicon.

In this way, first semiconductor material film 2a of support substrate 2 is separated from a second semiconductor material film, film 4, by electrically insulating layer 3.

A gate electrode 5 is formed on semiconductor material film 4. Gate electrode 5 is separated from semiconductor material film 4 by a gate dielectric 6.

Substrate 1 then successively comprises support substrate 2, electrically insulating layer 3, semiconductor material film 4, gate dielectric 6 and gate electrode 5.

In a particular embodiment, an insulating pattern 7 is formed to define the active area of the transistor. Insulating pattern 7 is formed around gate electrode 5 in substrate 1 with a part that is able to extend underneath gate electrode 5 so as to achieve a reliable delineation between the source and drain areas. Insulating pattern 7 penetrates into semiconductor film 4, electrically insulating layer 3 and support substrate 2. Insulating pattern 7 makes it possible to electrically insulate the future transistor from the other adjacent components and the future counter-electrode from the rest of substrate 1.

Figure 2:
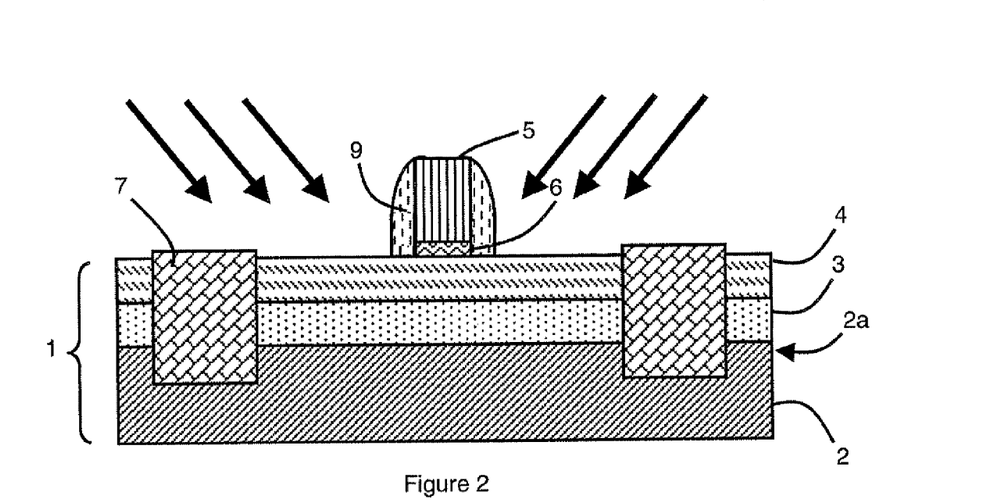
Figure 3:
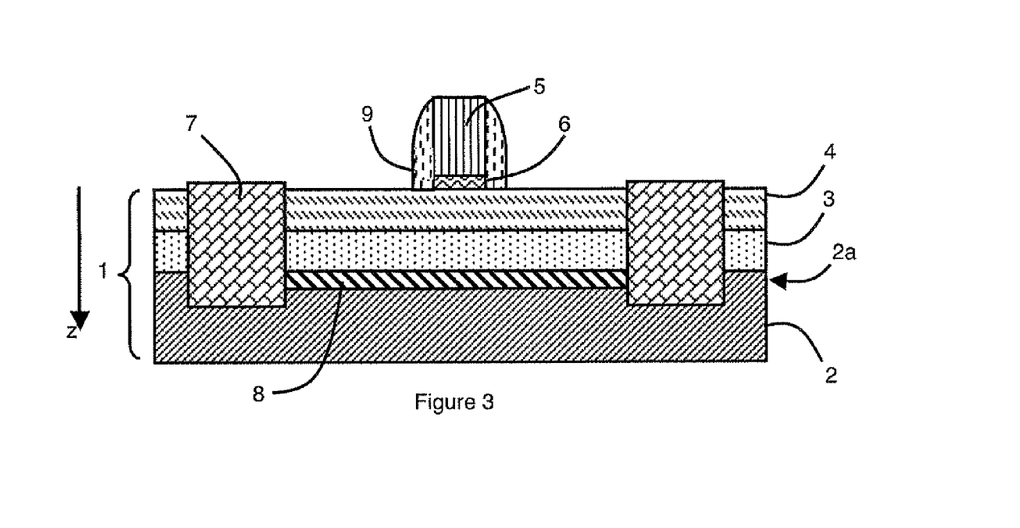

As illustrated in FIGS. 2 and 3, substrate 1 is subjected to a step of tilted ion implantation of a first doping impurity. This ion implantation enables a counter-electrode 8 to be formed by doping a part of first semiconductor film 2a. Counter-electrode 8 is of a first conductivity type and the conductivity type is imposed by the type of the first doping impurity. For example, if the first doping impurity is arsenic or phosphorous, counter-electrode 8 is of N-conductivity type. If on the contrary the first doping impurity is boron or indium, the counter-electrode is of P-conductivity type.

Figure 4:
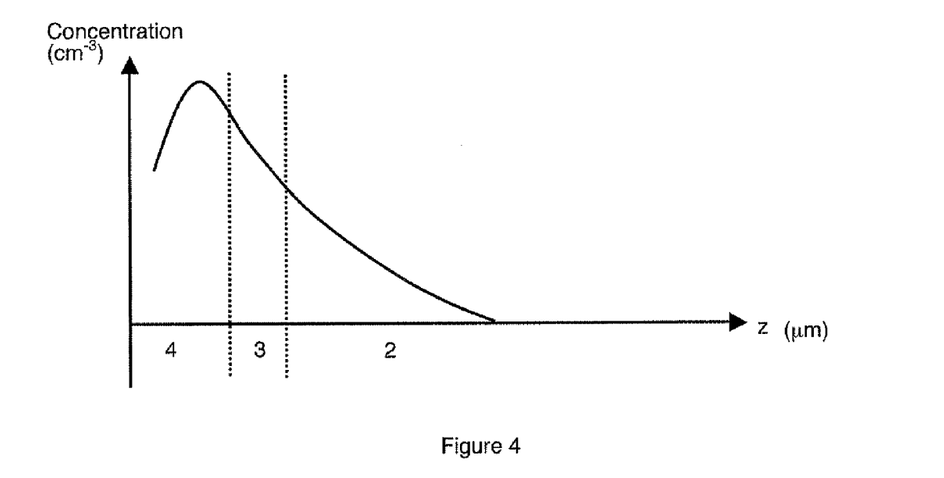
FIG. 4 represents the concentration profile of first doping impurity in the substrate along the line z illustrated in FIG. 3 in a particular implementation mode, FIGS. 5 and 6 schematically represent two particular embodiments of a field effect device, in cross-section.

Counter-electrode 8 acts electrostatically on the performances of the transistor by means of electrically insulating layer 3. As illustrated in FIG. 4, counter-electrode 8 comprises a decreasing first doping impurity concentration along the line z when moving progressively away from the interface between electrically insulating layer 3 and first semiconductor film 2a. The dopant concentration in FIG. 3 is represented with a logarithmic scale.

This particular doping profile enables a counter-electrode to be obtained having both a small depthwise dimension and a large electrostatic effect on the transistor and therefore on its electric performances. The depthwise dimension is defined in a direction perpendicular to the interface between the electrically insulating layer and semiconductor film 4. The depth is directed along a line z moving away from the interface between electrically insulating layer 3 and support substrate 2.

This particular doping profile enables a maximum electrostatic effect to be obtained, as the most doped area (with the highest concentration of first impurity) is located in immediate proximity to second semiconductor film 4 and therefore to the associated channel.

This profile also enables the influence of counter-electrode 8 on the adjacent devices to be reduced as doping decreases with the depth of penetration into support substrate 2. Under these conditions, the dimension along line z is small, which reduces the influence of counter-electrode 8 on the adjacent elements. This small dimension among other things enables less deep insulating patterns 7 between the different devices to be used and/or the counter-electrode insulating means, such as doped wells of opposite type, to be reduced.

In comparison, in the prior art, the doping profile of the counter-electrode is different as it is achieved right at the beginning of the implementation method.

In conventional manner, in the prior art, the maximum of dopant is placed at a distance from the interface between layer 3 and film 2a so as to have a maximum quantity of dopants in the support substrate and to greatly reduce parasitic doping in the conduction channel. There is therefore a large loss of efficiency in counter-electrodes of the prior art. The doping profile is not favorable to a good counter-electrode and can be partially eradicated by means of the different thermal anneals of the implementation method, but this results in an increase of the volume of the counter-electrode. However, the different thermal anneals are limited by the constraints that weigh on diffusion of the dopants from the source/drain electrodes to the channel.

The counter-electrode is formed by doping the substrate through the whole of the uncovered active area. Energetic implantation is performed to preserve the purity of the conduction channel which partly conditions the performances of the transistor. Precautions are taken in order not to make the future conduction channel amorphous, or to damage it.

The counter-electrode is furthermore not placed too far from the device and therefore from the interface between semiconductor film 2a and electrically insulating layer 3 in order to have a high electrostatic effect. These two conditions are therefore an incitement to use a high implantation energy and to take advantage of the future thermal budgets to improve the dopant profile in the counter-electrode.

To obtain a decreasing profile in the support substrate when moving away from the interface between electrically insulating layer 3 and semiconductor film 2a, it is preferable to choose the implantation energy such as to have the maximum first doping impurity concentration in insulating layer 3 or in second semiconductor film 4. The implantation tail then performs doping of first semi-conductor film 2a in order to form counter-electrode 8 with the required profile. The implantation energy is lower than in the prior art as a smaller implantation depth is sought for, the channel already being defined and protected by the gate. The implantation peak can also be placed in immediate proximity to the interface between insulating layer 3 and semi-conductor film 2a.

The implantation step is performed after formation of gate electrode 5. Gate electrode 5 is used as a mask. Under these conditions, the conduction channel has not undergone any parasitic implantation which makes it possible to obtain a non-intentionally doped conduction channel or a channel whose implantation profile is perfectly controlled. This position of the ion implantation step enables a transistor to be formed with a good carrier conduction in the conduction channel. The implantation conditions are chosen such as to obtain continuous doping underneath gate electrode 5. In this way, although the conduction channel is protected by gate electrode 5, the first doping impurity can be incorporated underneath the conduction channel in support substrate 2.

The ion implantation step is said to be tilted as it presents a non-zero implantation angle, i.e. ion implantation is performed with an angular offset with respect to the perpendicular to the surface of substrate 1, here of second semiconductor film 4.

The implantation angle is chosen so as to form a continuous doped area underneath gate electrode 5 in first semiconductor film 2a and therefore at the surface of support substrate 2 without doping the conduction channel. The implantation angle can introduce a few dopant impurities underneath gate 5 according to the chosen implantation angle. This implantation will have the effect of reducing the size of the conduction channel. The person skilled in the art will choose the implantation angle so as to keep a sufficient gate length to preserve the transistor effect while at the same time ensuring a good distribution of the dopant species under the conduction channel in support substrate 2.

The implantation angle is a function of the length of gate 5 taking possible spacers 8 into account. The implantation angle also takes account of the thickness of semiconductor film 4 underneath the gate and of the thickness of electrically insulating layer 3. The physical gate length corresponds to the distance separating the source electrode and drain electrode.

The implantation angle has to be greater than or equal to the value obtained with the following geometric formula:

$$\beta = \arctan\left(\frac{\frac{L}{2}}{T_4 + T_3}\right)$$

with
L/2, the half-length of the gate electrode including the lateral spacers present during implantation, if any
$T_4+T_3$, the total thickness of electrically insulating layer 3 and of semi-conductor film 4 underneath the gate electrode.

For example, a minimum implantation angle of 25.8° is used for a gate having a length of 30 nm located on a semiconductor film with a thickness of 6 nm and on an electrically insulating layer 3 with a thickness of 25 nm. For a gate having a length of 46 nm located on a semiconductor film with a thickness of 6 nm and on an electrically insulating layer 3 with a thickness of 10 nm, the minimum implantation angle is equal to 55.2°.

The implantation energy is chosen such that a sufficient quantity of first doping impurity reaches first semiconductor film 2a. The implantation energy is therefore a function of the distance to be covered before reaching the interface between electrically insulating layer 3 and first semiconductor film 2a. Thus, the greater the thickness of semiconductor material layer 4 and/or the thickness of electrically insulating layer 3, the higher the implantation energy.

The implantation energy is chosen so as to incorporate the first doping impurity in first semiconductor film 2a of support substrate 2 in order to have a decreasing concentration profile the deeper the penetration into support substrate 2, i.e. the greater the distance from the gate electrode. There is therefore a decreasing first doping impurity concentration in first semiconductor material film 2a starting from the interface between first semi-conductor film 2a and electrically insulating layer 3.

The person skilled in the art will also take account of the dose and nature of the implanted element in order to prevent amorphization of second semiconductor film 4 and possibly of first semiconductor film 2a. However, if a large dose is necessary, the latter can be divided into a plurality of elementary doses separated by an annealing step in order to reduce the risks of amorphization. In preferential manner, the operating conditions chosen for implantation are such that the first doping impurity concentration is greater than or equal to $10^{18}$ atoms/cm$^3$ at the interface between layer 3 and film 2a, but this value can vary according to the distance between counter-electrode 8 and semiconductor film 4.

This particular concentration profile is obtained by using a low implantation energy which also incorporates the first doping impurity in semiconductor material layer 4 at the level of the non-protected areas and/or in electrically insulating layer 3. The implantation technique used is conventional with a lower implantation energy than in the prior art in order to place the maximum concentration in semiconductor film 4 or in electrically insulating layer 3.

Producing counter-electrode 8 after formation of gate electrode 5 enables the depthwise penetration of counter-electrode 8 in support substrate 2 to be reduced. In the prior art, the depthwise penetration results from the use of high implantation energies (typically about 100 KeV) in order not to implant doping impurities in the channel, and also from the use of diffusion linked to the thermal budgets in order to smooth the dopant profile. Delayed fabrication of counter-electrode 8 in the fabrication method also enables implantation of insulating pattern 7 to be postponed, which has the effect of making the latter more resistant to the different wet etching processes and of improving the reliability of the final device.

In preferential manner, the implantation step is performed for gate lengths of less than 50 nm which enables low implantation angles to be used and enables a continuous doped counter-electrode to be easily achieved under the gate electrode and therefore facing the conduction channel directly after implantation.

In a manner that is also preferential, the use of a thin film substrate, i.e. a substrate having a total thickness of film 4 with layer 3 of less than 40 nm, enables low implantation energies to be used. In this energy range, it is advantageous to make use of lateral spacers 9 of gate electrode 5 to protect gate dielectric 6 and the conduction channel against parasitic implantation. It is then easy to perform implantation without adding protective layers to the device.

In a particular embodiment illustrated in FIG. 4, the implantation conditions are chosen such as to have the maximum first doping impurity concentration implanted in semiconductor material film 4. In this instance, the first doping impurity concentration decreases continuously through electrically insulating layer 3 and support substrate 2.

Electrically insulating layer 3 is then doped underneath source and drain electrodes 6 and presents a non-doped portion underneath the conduction channel.

Figure 5:
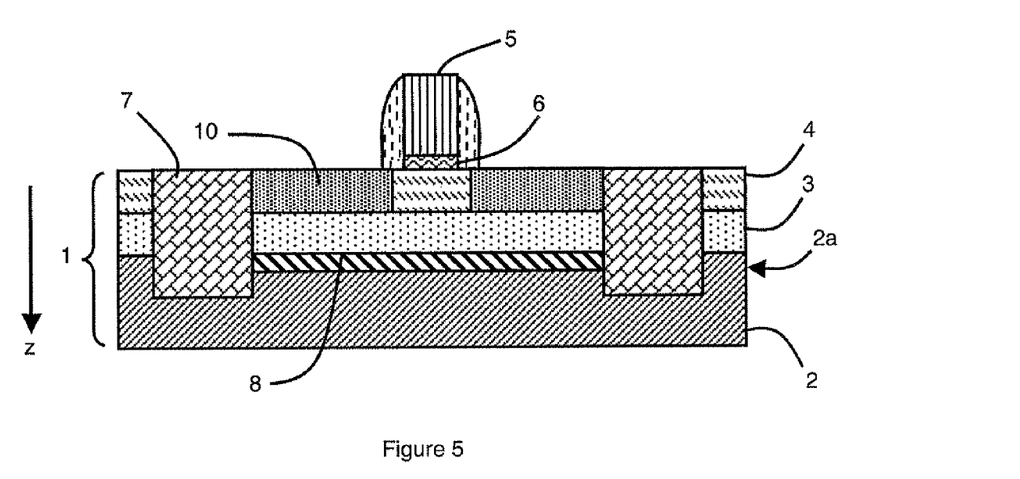

As illustrated in FIG. 5, the first doping impurity implantation step can be used to define counter-electrode 8 and source and drain electrodes 10. Source and drain electrodes 10 of the transistor are then of the same conductivity type as counter-electrode 8.

Figure 6:
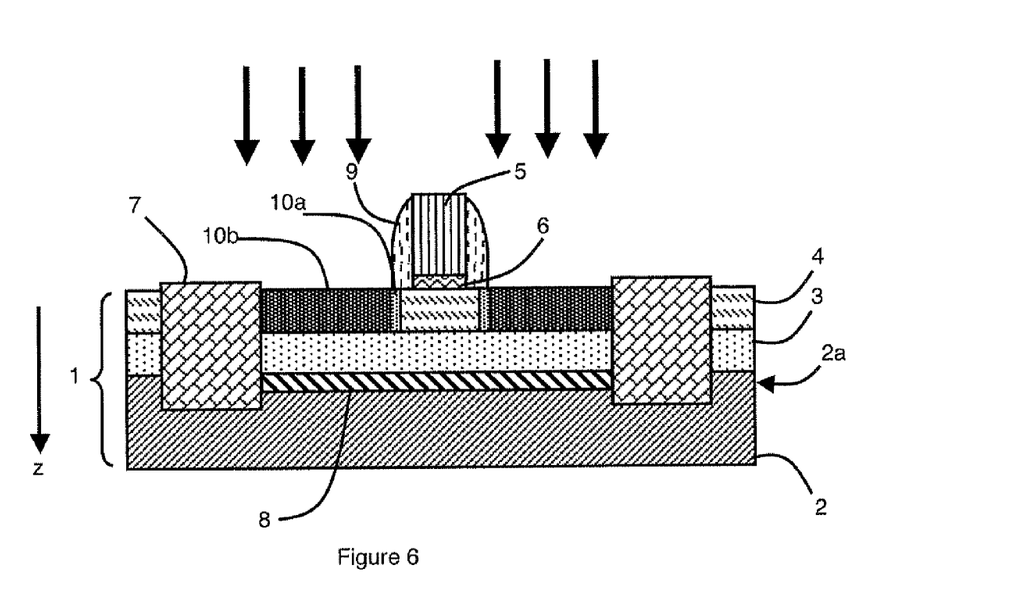

In even more preferential manner and as illustrated in FIG. 6, this implantation step forms intermediate doping areas 10a which exist between highly doped areas 10b of source/drain electrodes 10 and the conduction channel. This first implantation step is then followed by an additional implantation step, generally perpendicular to the surface of substrate 1, so as to form two highly doped areas on which the source and drain contacts will be made. The two implantation steps are performed with the same doping impurity or with impurities of the same type. The source/drain electrodes each comprise an intermediate doping area 10a which is located between the conduction channel and a more highly doped area 10b which serves the purpose of connection of the future source/drain contacts. This intermediate doping area 10a enables more reliable devices to be obtained, for example by reducing the risks of hot carriers.

The first doping impurity concentration in first and second source/drain electrodes 10 is continually decreasing from semiconductor material film 4 down to support substrate 2.

Figure 7:
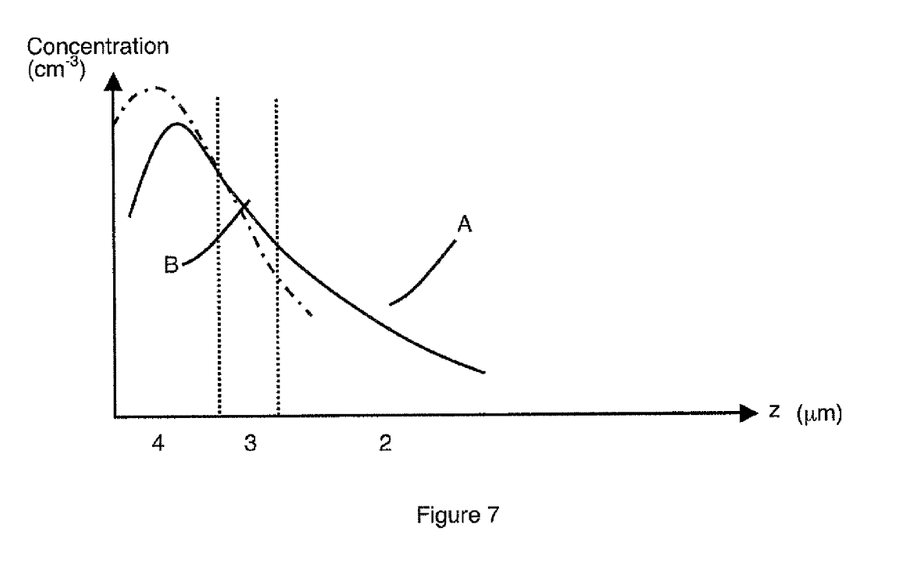
FIG. 7 represents two concentration profiles resulting from two distinct implantation steps in the substrate along the line z illustrated in FIG. 3 in a particular implementation mode, FIGS. 8 to 10 schematically represent an alternative embodiment of a field effect device, in cross-section.

This embodiment is particularly interesting as it enables source/drain electrodes 10 and counter-electrode 8 to be formed with a small number of steps. For example, the dopant profile illustrated in FIG. 4 represents the dopant profile from a source/drain electrode down to the support substrate. As illustrated in FIG. 7, an additional implantation can be performed in the source/drain areas to form the source/drain electrodes with the required dopant profile. The dopant profile illustrated by curve plot A corresponds for example to a tilted implantation simultaneously forming counter-electrode 8 and intermediate doping areas underneath the lateral spacers. Curve plot B corresponds for example to a vertical additional implantation so as to form the most highly doped areas of the source/drain electrodes. The implantation conditions being different, the dopants originating from the additional implantation participate very little in formation of the counter-electrode. Dopant impurities that are identical or of the same kind of conductivity are implanted to form curve plots A and B.

In another embodiment mode, source/drain electrodes 10 are of opposite conductivity type to that of counter-electrode 8. A second doping impurity of opposite type to the first doping impurity is then implanted in source/drain electrodes 10 so as to obtain an opposite conductivity type. A first doping profile linked to the first doping impurity and a second doping profile linked to the second doping impurity of opposite type then exist. As in the foregoing, several implantations are possible in order to form a highly doped area and an intermediate doping area in the source/drain electrodes.

The doping profile illustrated in FIG. 7 can also represent this configuration, but impurities of opposite types are used between curve plots A and B. The type of impurity associated with plot A corresponds to the type of counter-electrode 8. In the illustrated case, the source and drain electrodes present the two opposite types of impurities as does the counter-electrode.

The first doping impurity forms the majority compared with the second doping impurity in support substrate 2 to form counter-electrode 8. The first doping impurity has a decreasing concentration from the interface between electrically insulating layer 3 and first semiconductor film 2a. The second doping impurity has a concentration that is also decreasing and always lower than that of the first impurity, or the second impurity is absent as it has been stopped by electrically insulating layer 3 or it is of considerably lower concentration.

The second doping impurity forms the majority compared with the first doping impurity in second semiconductor film 4 in order to impose the second type of conductivity in source/drain electrodes 10.

In preferential manner, the implantation conditions are chosen such that the second doping impurity presents a greatly decreasing concentration in electrically insulating layer 3. In this way, the second doping impurity plays a negligible role in operation of counter-electrode 8.

In also preferential manner, the implantation conditions are chosen such that the first doping impurity presents a maximum concentration in electrically insulating layer 3. The first doping impurity is preferably not present in semi-conductor film 4 so as to have a negligible role in operation of source and drain electrodes 10.

This approach enables a plurality of transistors each having a specific counter-electrode to be easily formed. By means of an easy masking set, it is possible to co-integrate transistors having source/drain electrodes having the same type of conductivity as their counter-electrode of N-type or P-type.

It is also possible to easily co-integrate transistors having source/drain electrodes 10 of a first type of conductivity and a counter-electrode 8 of opposite type next to transistors having the same type of conductivity for their source/drain electrodes 10 and their counter-electrode. The counter-electrode formation step can be common if all the electrodes are of the same type of conductivity. It is then sufficient to perform differentiation of the transistors by means of an additional implantation step of source/drain electrodes 10 to obtain different source/drain electrodes 10 depending on the transistors.

It is further possible to combine these different embodiments so as to obtain completely different transistors on the same substrate by mutualizing the implantation steps. A first implantation is used to form an N-type counter-electrode 8 whatever the type of the final transistor. A second implantation is used to form a P-type counter-electrode 8 whatever the type of the final transistor. Two other implantations are then used to form source/drain electrodes 10 of the required type.

Depending on the implantation angle used, the dopant concentration profile in the counter-electrode varies with the position. By choosing a large implantation angle, the area of support substrate 2 facing the conduction channel is implanted from each side of the gate, i.e. from the source area and from the drain area. The dopant element concentration is higher in the conduction channel than underneath source and drain electrodes 6 while preserving the required profile. This profile is preferable to reduce coupling with the source and drain electrodes while at the same time keeping a high coupling with the conduction channel. This particular doping profile enables a strong electrostatic coupling to be preserved underneath the conduction channel and also enables the quantity of dopant present in immediate proximity to the insulating pattern to be reduced in order to reduce the influence of the counter-electrode on the neighboring devices. In other words, counter-electrode 8 comprises a first concentration of the first doping impurity facing the gate electrode and a second concentration of the second doping impurity facing the source/drain electrodes, the second concentration being lower than the first concentration.

By choosing a smaller implantation angle, it is possible to have an opposite profile, i.e. a higher concentration underneath source and drain electrodes 6 in comparison with that which is present underneath the channel.

Such a concentration profile can also be obtained by means of an additional vertical implantation, for example the vertical implantation used to form source and drain electrodes 6.

In a particular embodiment, the use of an implantation mask comprising a photoresist part located at the periphery of the active area on the semi-conductor film and/or on the insulating pattern can limit the lateral extent of the counter-electrode and/or the quantity of dopants in immediate proximity to insulating pattern 7. This enables the influence of counter-electrode 8 on the neighboring devices to be reduced.

In the particular embodiments described in the foregoing, electrically insulating layer 3 comprises a doped part. The doped area of electrically insulating layer 3 can be used as a different material from the rest of layer 3 that is able to be selectively etched with respect to the non-doped material.

In another embodiment, this particularity enables a device having improved electric performances to be formed, electrically insulating layer 3 presenting distinct areas on account of the doping. This difference of behavior subsequently enables a heterogeneous layer 3 with three distinct areas to be formed. These distinct areas form different capacitors. There is a first capacitor having electrodes which are formed by the channel and support substrate 2 and which are separated by electrically insulating layer 3. Second and third capacitors are present and successively comprise support substrate 2, electrically insulating layer 3 and source or drain electrodes 6.

The coupling capacitances of the transistor with support substrate 2 are different between the conduction channel and the source/drain electrodes.

Insulating layer 3 can be broken down into three areas, each area being associated with a specific part of the transistor (of semiconductor film 2) so as to form a capacitor.

The value of the coupling capacitances of the capacitors is measured between support substrate 2 and semiconductor film 4 in the portions facing one another. The coupling capacitance value takes account of the different materials that are to be found between support substrate 2 and semi-conductor film 4 and of their thickness. The coupling capacitance value also takes account of the surface of the facing electrodes.

First area 3a is located facing gate electrode 5, here underneath the gate electrode and therefore underneath the conduction channel. First area 3a presents a first dielectric constant value between support substrate 2 and semiconductor film 4. First area 3a forms part of the first capacitor with a first coupling capacitance value per surface unit.

A second area 3b is located facing the source electrode and presents a second dielectric constant value. Second area 3b forms part of the second capacitor with a second coupling capacitance value per surface unit. The second coupling capacitance value per surface unit is lower than the first coupling capacitance value per surface unit. This difference between the first and second coupling capacitance values can result from the fact that the dielectric constant value of electrically insulating layer 3 in second area 3b is lower than the first dielectric constant value in first area 3a, the distance separating the electrodes being identical between areas 3a and 3b. This difference can also result from the fact that the distance separating the two electrodes is larger in second area 3b than in first area 3a, the material forming the electrically insulating layer being identical in first and second areas 3a and 3b. This difference of coupling capacitance can further result from a combination of the above two cases.

A third area 3c is located facing the drain electrode and presents a third coupling capacitance value per surface unit. The third coupling capacitance value per surface unit is lower than the first coupling capacitance value per surface unit. The difference between the first and third coupling capacitance values per surface unit can result from the same reasons as those explained in the foregoing for the second coupling capacitance.

In the remainder of the description, the term coupling capacitance per surface unit is replaced by the term coupling capacitance. The coupling capacitance per surface unit corresponds to the ratio between the permittivity of the dielectric present between the two electrodes of the capacitor and the distance separating the electrodes. This architecture enables the coupling capacitance to be reduced (by modifying the coupling capacitance per surface unit) without modifying the design of the transistor.

The difference of coupling capacitance is observed between semiconductor film 4 and support substrate 2, i.e. it arises from a difference of thickness between the facing areas and/or from a difference of material used between the two electrodes of the capacitor which results in a difference of the permittivity over thickness ratio ($\in/e$).

Electrically insulating layer 3 is modified by implantation to form two different materials presenting an etching selectivity between them. A sacrificial material 11 is formed when implantation of the doping impurity of counter-electrode 8 is performed. Sacrificial material 11 is formed by implantation in the material initially forming electrically insulating layer 3. After the implantation step, there are in layer 3 areas of sacrificial material 11 and areas of material to be kept.

In an alternative embodiment that can be combined with the previous embodiment, the sacrificial material is formed when vertical implantation of the source/drain electrodes is performed. In this instance, a new material is formed underneath the uncovered areas.

The implantation mask used comprises gate electrode 5. In certain particular embodiments, the implantation mask can also contain other patterns formed for example by means of a photoresist. The photoresist can be used for example to limit doping of insulating pattern 7 as doping can make the latter more sensitive to the subsequent wet process etching steps.

Figure 8:
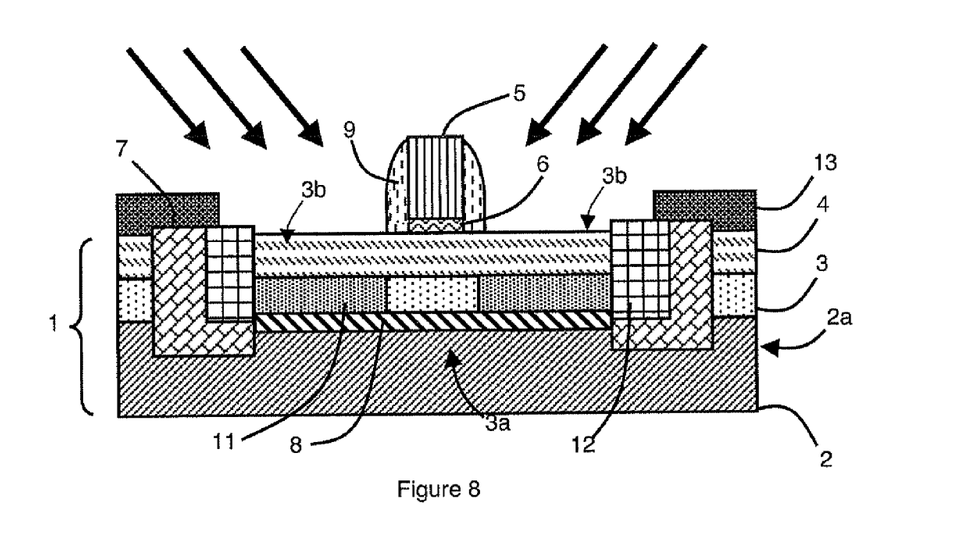

In a particular embodiment also illustrated in FIG. 8, the implantation step also forms an additional sacrificial material 12 in insulating pattern 7. In an alternative embodiment also illustrated in FIG. 8, the implantation mask is formed partly by gate electrode 5 and partly by a resin 13. For example, resin 13 forms a pattern above insulating pattern 7 in order to limit the extent of additional sacrificial material 12 in insulating pattern 7 while preserving the self-alignment of first area 3a with respect to gate 5.

As gate electrode 5 is used as implantation mask, there is self-alignment of gate electrode 5 with first area 3a where the material of the electrically insulating layer is preserved. According to the embodiments, implantation can be performed with a more or less large implantation angle. The variations in the implantation conditions (implantation angle, implantation energy, implanted dose) enable the dimensions of area 3a to be defined with respect to the dimensions of gate electrode 5 with its lateral spacers 9 if any.

For example, for an electrically insulating layer 3 made from silicon oxide, implantation of arsenic or indium is performed in order to form a doped silicon oxide which can be etched at a faster rate than non-doped silicon oxide. Etching is advantageously performed by means of hydrofluoric acid, preferably in the form of gaseous anhydrous HF.

In the case where insulating pattern 7 is made from the same material as electrically insulating layer 3, sacrificial material 11 and additional sacrificial material 12 are identical and react to the same etching chemistry. It is then possible to form a preferred degradation path of sacrificial material 11 passing via insulating pattern 7. The extent of the parasitic etching in insulating pattern 7 is linked to the etching selectivity that exists between sacrificial material 11 and the material forming insulating pattern 7 and area 3a.

When gate electrode 5 is used as implantation mask, it is advantageous for the formation operation of sacrificial material 11 to be performed at the same time as formation of the source and drain electrodes and of counter-electrode 8 if the dopant material is implanted with a concentration such that it allows formation of sacrificial material 11.

In this instance, after the implantation step, area 3a is located underneath gate electrode 5 and corresponds to the volume of insulating layer 3 that has not been implanted. The second portion of layer 3 of sacrificial material 11 corresponds to areas 3b and 3c and is located underneath source and drain electrodes 10.

These two portions are formed by different materials and react to different etching chemistries and/or to the same etching chemistry but with different etch rates in order to obtain a certain etching selectivity.

Figure 9:
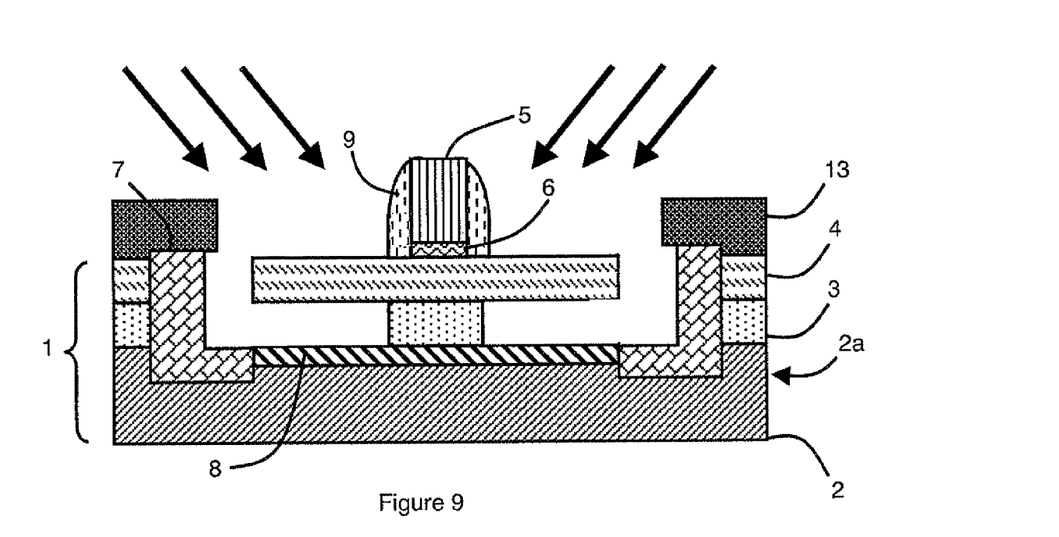

As illustrated in FIG. 9, a first hole is formed in insulating pattern 7 and/or in semiconductor film 4 to have access to second area 3b of electrically insulating layer 3. A second hole is formed in the insulating pattern and/or in semiconductor film 4 to have access to third area 3c of electrically insulating layer 3.

In an embodiment that is not represented, the hole is formed by complete elimination of insulating pattern 7 over a part of the thickness of the latter so as to reach sacrificial material 11 and/or additional sacrificial material 12. The top part of insulating pattern 7 can be eliminated in isotropic or anisotropic manner to allow access to additional sacrificial material 12 which will then give access to sacrificial material 11.

It is also possible to use a photoresist pattern 11 to eliminate the whole of the surface of the insulating pattern by forming sacrificial material 12 or not.

In the embodiment illustrated in FIG. 8, the hole is formed by elimination of a part of the surface of insulating pattern 7 to reach sacrificial material 11 and/or additional sacrificial material 12. In the illustrated example, only a part of insulating pattern 7 is accessible and etched. This localized etching is obtained for example by means of an etching mask associated with an anisotropic etching, but isotropic etching is also possible.

The hole can have any shape and surface provided that the hole allows access to sacrificial area 11.

As a variant, it can also be envisaged to only form a single hole which simultaneously gives access to the two areas 3b and 3c. In a particular implementation, insulating pattern 7 is eliminated around the transistor until second area 3b and third area 3c of insulating layer 3 are reached.

The hole is preferably formed in insulating pattern 7 as this enables the dimensional and alignment constraints to be relaxed to ensure access to electrically insulating layer 3. When the hole is formed in insulating pattern 7 or by elimination of insulating pattern 7, it is preferable to form additional sacrificial material 12 which will allow a greater flexibility in the forthcoming degradation process.

In another alternative embodiment, it can be envisaged to form source/drain electrodes 6 that are partially made from porous silicon or silicide so as to allow access to sacrificial layer 11 without forming any holes in insulating pattern 7 or in the source/drain electrodes.

As illustrated in FIG. 9, once second area 3b and third area 3c of insulating layer 3 are accessible, these two areas are eliminated by means of a suitable etching chemistry.

In this way, first area 3a is preserved between gate electrode 5 and support substrate 2, and second area 3b and third area 3c are formed by void areas. First area 3a forms a mechanical support area which enables the source and drain areas to be suspended above support substrate 2. The suspended areas are located on each side of support area 3a. Due to the etching selectivity that exists between sacrificial material 11 and the material to be kept, the support area is located facing gate electrode 5, along the gate electrode. The support area at least partially supports the transistor throughout the process.

In an alternative embodiment, elimination of second area 3b and third area 3c of insulating layer 3 is performed by any suitable technique, for example by means of thermal degradation or degradation by electromagnetic or electronic radiation. These techniques are for example used to form interconnection structures with air-gaps. The hole formed then serves the purpose of removing the degradation sub-product.

In yet another alternative embodiment, the hole is not necessary if a porous electrically insulating material is present in insulating area 7 and enables a degradation agent and/or the degradation sub-product to pass through to electrically insulating layer 3. For example, two categories of materials can be envisaged, silicon oxides doped by hydrogen, carbon or fluorine and which are typically noted in the form SiOCH, SiCH or SiOF, and porous organic polymers not containing silicon such as carbon-based materials, for example a carbon matrix which is doped by hydrogen and noted CH or a carbon matrix doped by fluorine and noted CF.

It is also possible to use a material that is permeable to the degradation agent and/or to the degradation sub-product instead of the hole and the porous material. The porous or permeable material avoids formation of a hole which preserves a high reliability of the device.

Once electrically insulating layer 3 has been partially eliminated, here with elimination of sacrificial material 11, it presents areas with different dielectric constants according to the criteria defined above.

The field effect device is electrically insulated from support substrate 2 and source/drain electrodes 10 do not have, opposite, the same dielectric material as the conduction channel.

In this embodiment, the portions of semiconductor film 4 forming the source and drain electrodes are suspended. This configuration enables the stresses initially present or induced by the fabrication method to be at least partially relaxed. Semiconductor film 4 is maintained in suspension by means of the part of the electrically insulating layer that is facing the channel, which enables the set of stresses in the conduction channel to be maintained.

Relaxation of the set of stresses can be complete or almost complete if insulating pattern 7 is etched so as to reduce its thickness around the active area of the transistor to access electrically insulating layer 3. The side walls of the semiconductor film are free. Relaxation of the set of stresses can be partial if access to the electrically insulating layer is obtained by means of a hole formed in the insulating pattern or in semiconductor film 4 which limits possible strains of the semiconductor film to relax. There can also be transformation or preservation of the set of initial stresses if access to electrically insulating layer 3 is obtained by means of a porous material, insulating pattern 7 remaining in contact with semiconductor film 4.

Figure 10:
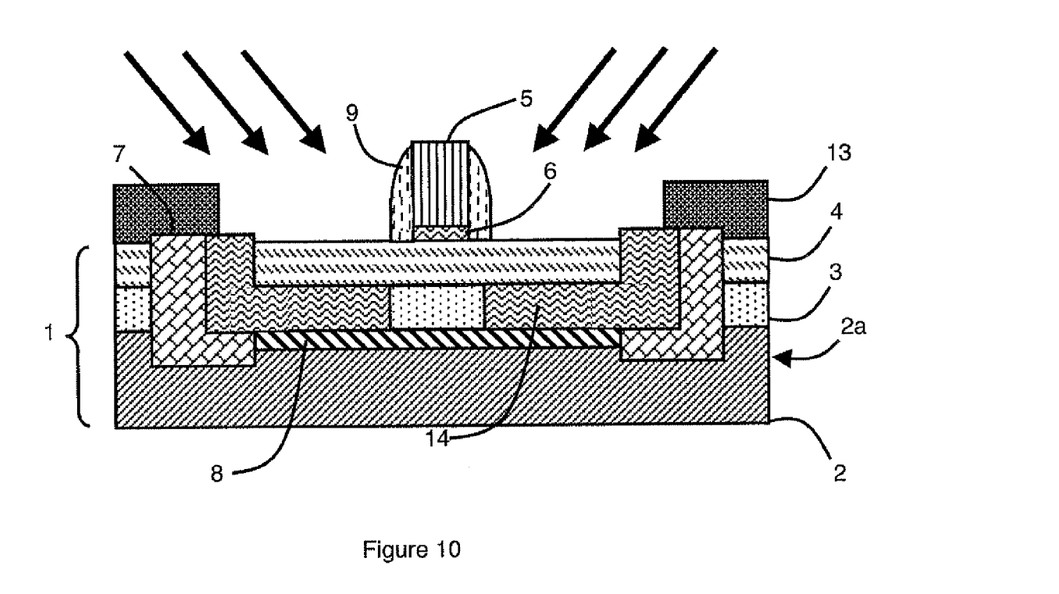

In a particular embodiment illustrated in FIG. 10, it is then possible to fill the void areas with an additional insulating material 14 that is different from the material constituting area 3a so as to enhance the electric reliability and mechanical stability of the structure while at the same time preserving good electrostatic properties. This additional insulating material 14 is for example a material having a dielectric constant that is lower than that of silicon oxide, such as advantageously a porous material. The additional insulating material is for example deposited by spin-coating.

When the void area is filled by a new insulating material 14, a new set of stresses can be introduced into the source and drain electrodes and to a lesser extent into the conduction channel. By means of this embodiment, it is then possible to form a transistor with a complex set of stresses. The channel and source/drain electrodes are subjected to different sets of stresses. This embodiment enables two transistors having different sets of stresses to be co-integrated simply.

This embodiment is particularly interesting as it enables the areas to be eliminated to be easily delineated and self-alignment with respect to the conduction channel to be achieved. The set of stresses can therefore remain symmetric with respect to the conduction channel.

In another implementation method which can be combined with the previous embodiments, support substrate 2 and/or uncovered semiconductor film 4 can be partially etched in order to increase the distance between these two layers. Increasing the distance is favorable to obtaining a more reliable capacitance underneath the source/drain electrodes compared with the conduction channel in the case where the same material is present facing the channel and source/drain electrodes 10. Different materials can also be used to have a more marked effect.

As indicated in the foregoing, different techniques can be envisaged to have access to the second and third areas of insulating layer 3. It is also possible to perform simultaneous access to the two areas 3b and 3c or consecutive accesses. In the embodiments described in the foregoing, simultaneous access is had to areas 3b and 3c so as to empty the latter during one and the same technological step and if applicable to fill them at the same time.

It can also be envisaged to empty them consecutively using different masks to access the source area or the drain area. It is further possible to use a single mask with a plug which masks one of the two areas.

It is further possible to fill the areas at the same time with the same material or to use different materials. If different materials are used between the source and drain, it is advantageous to consecutively eliminate areas 3b and 3c to fill them progressively or to use a plug to protect one area while the other area is filled with the required insulator. This embodiment enables area 3b to be formed with a particular material and area 3c to be formed with a different material.

The implantation mask can also be used as etching mask with anisotropic etching by choosing to etch insulating pattern 7 in the uncovered area until sacrificial material 11 and/or additional sacrificial material 12 is reached.

In advantageous manner, the hole which enabled access to sacrificial materials 11, 12 is filled so as to prevent dust from remaining stuck in the hole which is detrimental to the reliability of the device. This possibility is particularly interesting when access to electrically insulating layer 3 has been made via insulating pattern 7, which generally results in the presence of a hole of large size.

The use of a transistor having a weaker capacitance underneath the source and drain electrodes compared with that which is present underneath gate electrode 5 enables the electrostatic coupling between the source/drain electrodes and substrate 2 to be reduced, thereby enabling a faster transistor to be obtained than with a homogeneous insulating film 3. Preserving a higher capacitance underneath the conduction channel enables a large electrostatic coupling with support substrate 2 to be kept. This configuration is particularly interesting when a counter-electrode 8 is used in support substrate 2. This architecture enables the parasitic capacitances at the level of source and drain electrodes 10 to be reduced while at the same time enabling the transistor to take advantage of good control of short channel effect and of threshold voltage modulation effects. This architecture improves the dynamic performances of the transistor without impairing its static performances.

Electrically insulating layer 3 can be formed by a single material that is present between support substrate 2 and semi-conductor film 4 facing the different electrodes. The material then presents variable thicknesses so as to have a weaker coupling at the level of the source/drain electrodes compared with the coupling in the conduction channel.

Electrically insulating layer 3 can also be formed by a stack of several layers with variable thicknesses according to the areas in order to obtain a variation of the global dielectric constant. Stacking of the layers is performed in a direction that connects support layer 2 to semiconductor film 4.

It is possible to combine the previous two embodiments in order to have an electrically insulating layer comprising different constituents and different materials underneath gate 5 and underneath source/drain electrodes 10.

In yet another embodiment which can be combined with the previous embodiments, the variation of capacitance can also result from the use of different materials according to the capacitors. Thus, for example purposes, a first electrically insulating material is used underneath gate electrode 5 with a first dielectric constant. This first material forms the electrically insulating layer in area 3a. A second electrically insulating material is used underneath the source electrode and forms the electrically insulating layer in area 3b. A third electrically insulating material is used underneath the drain electrode and forms the electrically insulating layer in area 3c. There is then a stack of layers in the direction parallel to the axis connecting the source electrode to the drain electrode. The second and third materials are chosen such as to have a lower dielectric constant than that of the first material if the thickness between the three areas is identical.

In a particular embodiment, the thickness of electrically insulating layer 3 is constant and there are different materials that are used to define the different areas 3a, 3b and 3c. In a particular embodiment, areas 3b and 3c are formed by the same material and area 3a is formed by another material.

Depending on the embodiments used, the difference of capacitance between the different areas 3a, 3b and 3c can result from the use of several layers having different dielectric constants. The difference of capacitance can further be obtained by using identical films, but with different thicknesses. As indicated in the foregoing, it is also possible to combine these two embodiments.

In a privileged embodiment, the value of the second capacitance is equal to that of the third capacitance (for equal surfaces). These two areas can then have identical materials with the same thickness or with different thicknesses with materials compensating this thickness difference.

In an even more privileged embodiment which can be combined with the previous embodiment, second area 3b and/or third area 3c can comprise a void area or be formed by a void. The use of a void area enables a low dielectric constant and therefore a weak coupling with respect to source and drain electrodes 10 to be easily obtained. The void area is an insulating area which can be formed by a gaseous element with a predefined pressure, for example a gas at sub-atmospheric pressure. The source electrode and/or drain electrode is then suspended above support substrate 2 and area 3a acts as mechanical support area.

In an embodiment which can be combined with the previous embodiments, support substrate 2 comprises a counter-electrode 8 which is formed facing gate electrode 5 and advantageously facing source and drain electrodes 10. Counter-electrode 8 enables the operation of the transistor to be modified by modulating the coupling with the conduction channel.

In advantageous manner, insulating pattern 7 surrounds the transistor and seals off access to second area 3b and/or third area 3c when the latter is void. The void area is delineated by support substrate 2 and semiconductor film 4. It is delineated laterally by first area 3a and by insulating pattern 7 by means of a side wall of insulating pattern 7 which connects semi-conductor film 4 to support substrate 2. This side wall is preferably flat. This configuration does not enable access to be had to the void area throughout the implementation method, which increases the reliability of the transistor while at the same time reducing the risks of parasitic pollution stuck in the void area. The same can be the case when second area 3b and/or third area 3c comprise(s) a void, for example when second area 3b and/or third area 3c is/are partly formed by an insulating solid material and by a void.

The invention claimed is:

1. A field effect device comprising:
   a substrate of semiconductor on insulator type successively provided with a support substrate, an electrically insulating layer and a semiconductor material layer,
   first and second source/drain electrodes formed in the semiconductor material layer,
   a conduction channel formed in the semiconductor material layer and separating the first and second source/drain electrodes,
   a counter-electrode formed by a doped area of the support substrate having a decreasing first doping impurity concentration from an interface between the electrically insulating layer and the support substrate and covering the first and second source/drain electrodes and the conduction channel,
   wherein the first doping impurity concentration is continuously decreasing in a direction perpendicular to the interface between the semiconductor material layer and the electrically insulating layer.

2. The device according to claim 1, wherein the counter-electrode is of the same type of conductivity as the first and second source/drain electrodes, the first doping impurity concentration in the first and second source/drain electrodes being continually decreasing from the semiconductor material film down to the support substrate.

3. The device according to claim 2, wherein the first and second source/drain electrodes comprise an intermediate doping area located between the conduction channel and a contact connection area, the first doping impurity concentration in the first and second source/drain electrodes being continually decreasing from the intermediate doping area down to the support substrate.

4. The device according to claim 1, wherein the counter-electrode is of opposite conductivity type to that of the source/drain electrodes, the first doping impurity concentration in the first and second source/drain electrodes is higher than the first doping impurity concentration at an interface between the electrically insulating layer and the semiconductor material film and is higher than a second doping impurity concentration in the first and second source/drain electrodes.

5. The device according to claim 1, wherein the counter-electrode comprises a first doping impurity concentration covering the gate electrode and a second doping impurity concentration covering the source/drain electrodes, the second doping impurity concentration being lower than the first doping impurity concentration.

6. The device according to claim 1, wherein the electrically insulating layer comprises a void area covering one of the first and second source/drain electrodes.

7. The device according to claim 1, wherein the semiconductor material layer is electrically separated from the support substrate by the electrically insulating layer.

* * * * *